(12) United States Patent
Bakhishev et al.

(10) Patent No.: US 9,893,148 B2
(45) Date of Patent: Feb. 13, 2018

(54) METHOD FOR FABRICATING A TRANSISTOR DEVICE WITH A TUNED DOPANT PROFILE

(71) Applicant: Mie Fujitsu Semiconductor Limited, Kuwana (JP)

(72) Inventors: Teymur Bakhishev, San Jose, CA (US); Sameer Pradhan, San Jose, CA (US); Thomas Hoffmann, Los Gatos, CA (US); Sachin R. Sonkusale, Los Gatos, CA (US)

(73) Assignee: MIE Fujitsu Semiconductor Limited, Kuwana (JP)

( * ) Notice: Subject to any disclaimer, the term of this patent is extended or adjusted under 35 U.S.C. 154(b) by 0 days.

(21) Appl. No.: 15/285,279

(22) Filed: Oct. 4, 2016

(65) Prior Publication Data
US 2017/0025501 A1    Jan. 26, 2017

Related U.S. Application Data

(60) Continuation of application No. 15/053,099, filed on Feb. 25, 2016, which is a division of application No.
(Continued)

(51) Int. Cl.
*H01L 29/02* (2006.01)
*H01L 29/10* (2006.01)
(Continued)

(52) U.S. Cl.
CPC .... *H01L 29/1033* (2013.01); *H01L 21/02532* (2013.01); *H01L 21/26506* (2013.01);
(Continued)

(58) Field of Classification Search
CPC ...................................................... H01L 29/02
See application file for complete search history.

(56) References Cited

U.S. PATENT DOCUMENTS 3,958,266 A   5/1976   Athanas
4,000,504 A   12/1976  Berger
(Continued)

FOREIGN PATENT DOCUMENTS

EP    0274278    7/1988
EP    0312237    4/1989
(Continued)

OTHER PUBLICATIONS

Banerjee, et al. "Compressing Non-Optical Effects using Electrically-Driven Optical Proximity Correction", Proc. of SPIE vol. 7275 7275OE, 2009.
(Continued)

*Primary Examiner* — Marvin Payen
(74) *Attorney, Agent, or Firm* — Baker Botts L.L.P.

(57) ABSTRACT

A transistor device with a tuned dopant profile is fabricated by implanting one or more dopant migrating mitigating material such as carbon. The process conditions for the carbon implant are selected to achieve a desired peak location and height of the dopant profile for each dopant implant, such as boron. Different transistor devices with similar boron implants may be fabricated with different peak locations and heights for their respective dopant profiles by tailoring the carbon implant energy to effect tuned dopant profiles for the boron.

3 Claims, 7 Drawing Sheets

Related U.S. Application Data

13/828,262, filed on Mar. 14, 2013, now Pat. No. 9,299,801.

(51) Int. Cl.
   *H01L 21/265* (2006.01)
   *H01L 29/66* (2006.01)
   *H01L 29/78* (2006.01)
   *H01L 21/02* (2006.01)

(52) U.S. Cl.
   CPC ...... *H01L 21/26513* (2013.01); *H01L 29/105* (2013.01); *H01L 29/1083* (2013.01); *H01L 29/6659* (2013.01); *H01L 29/66537* (2013.01); *H01L 29/66568* (2013.01); *H01L 29/7833* (2013.01)

(56) References Cited

U.S. PATENT DOCUMENTS

| | | | |
|---|---|---|---|
| 4,021,835 | A | 5/1977 | Etoh |
| 4,242,691 | A | 12/1980 | Kotani |
| 4,276,095 | A | 6/1981 | Beilstein, Jr. |
| 4,315,781 | A | 2/1982 | Henderson |
| 4,518,926 | A | 5/1985 | Swanson |
| 4,559,091 | A | 12/1985 | Allen |
| 4,578,128 | A | 3/1986 | Mundt |
| 4,617,066 | A | 10/1986 | Vasudev |
| 4,662,061 | A | 5/1987 | Malhi |
| 4,761,384 | A | 8/1988 | Neppl |
| 4,780,748 | A | 10/1988 | Cunningham |
| 4,819,043 | A | 4/1989 | Yazawa |
| 4,885,477 | A | 12/1989 | Bird |
| 4,908,681 | A | 3/1990 | Nishida |
| 4,945,254 | A | 7/1990 | Robbins |
| 4,956,311 | A | 9/1990 | Liou |
| 5,034,337 | A | 7/1991 | Mosher |
| 5,144,378 | A | 9/1992 | Hikosaka |
| 5,156,989 | A | 10/1992 | Williams |
| 5,156,990 | A | 10/1992 | Mitchell |
| 5,166,765 | A | 11/1992 | Lee |
| 5,208,473 | A | 5/1993 | Komori |
| 5,294,821 | A | 3/1994 | Iwamatsu |
| 5,298,763 | A | 3/1994 | Shen |
| 5,369,288 | A | 11/1994 | Usuki |
| 5,373,186 | A | 12/1994 | Schubert |
| 5,384,476 | A | 1/1995 | Nishizawa |
| 5,426,328 | A | 6/1995 | Yilmaz |
| 5,444,008 | A | 8/1995 | Han |
| 5,552,332 | A | 9/1996 | Tseng |
| 5,559,368 | A | 9/1996 | Hu |
| 5,608,253 | A | 3/1997 | Liu |
| 5,622,880 | A | 4/1997 | Burr |
| 5,624,863 | A | 4/1997 | Helm |
| 5,625,568 | A | 4/1997 | Edwards |
| 5,641,980 | A | 6/1997 | Yamaguchi |
| 5,663,583 | A | 9/1997 | Matloubian |
| 5,712,501 | A | 1/1998 | Davies |
| 5,719,422 | A | 2/1998 | Burr |
| 5,726,488 | A | 3/1998 | Watanabe |
| 5,726,562 | A | 3/1998 | Mizuno |
| 5,731,626 | A | 3/1998 | Eaglesham |
| 5,736,419 | A | 4/1998 | Naem |
| 5,753,555 | A | 5/1998 | Hada |
| 5,754,826 | A | 5/1998 | Gamal |
| 5,756,365 | A | 5/1998 | Kakumu |
| 5,763,921 | A | 6/1998 | Okumura |
| 5,780,899 | A | 7/1998 | Hu |
| 5,847,419 | A | 12/1998 | Imai |
| 5,856,003 | A | 1/1999 | Chiu |
| 5,861,334 | A | 1/1999 | Rho |
| 5,877,049 | A | 3/1999 | Liu |
| 5,885,876 | A | 3/1999 | Dennen |
| 5,889,315 | A | 3/1999 | Farrenkopf |
| 5,895,954 | A | 4/1999 | Yasumura |
| 5,899,714 | A | 5/1999 | Farremkopf |
| 5,918,129 | A | 6/1999 | Fulford, Jr. |
| 5,923,067 | A | 7/1999 | Voldman |
| 5,923,987 | A | 7/1999 | Burr |
| 5,936,868 | A | 8/1999 | Hall |
| 5,946,214 | A | 8/1999 | Heavlin |
| 5,985,705 | A | 11/1999 | Seliskar |
| 5,989,963 | A | 11/1999 | Luning |
| 6,001,695 | A | 12/1999 | Wu |
| 6,020,227 | A | 2/2000 | Bulucea |
| 6,043,139 | A | 3/2000 | Eaglesham |
| 6,060,345 | A | 5/2000 | Hause |
| 6,060,364 | A | 5/2000 | Maszara |
| 6,066,533 | A | 5/2000 | Yu |
| 6,072,217 | A | 6/2000 | Burr |
| 6,087,210 | A | 7/2000 | Sohn |
| 6,087,691 | A | 7/2000 | Hamamoto |
| 6,088,518 | A | 7/2000 | Hsu |
| 6,091,286 | A | 7/2000 | Blauschild |
| 6,096,611 | A | 8/2000 | Wu |
| 6,103,562 | A | 8/2000 | Son |
| 6,121,153 | A | 9/2000 | Kikkawa |
| 6,147,383 | A | 11/2000 | Kuroda |
| 6,153,920 | A | 11/2000 | Gossmann |
| 6,157,073 | A | 12/2000 | Lehongres |
| 6,175,582 | B1 | 1/2001 | Naito |
| 6,184,112 | B1 | 2/2001 | Maszara |
| 6,190,979 | B1 | 2/2001 | Radens |
| 6,194,259 | B1 | 2/2001 | Nayak |
| 6,198,157 | B1 | 3/2001 | Ishida |
| 6,218,892 | B1 | 4/2001 | Soumyanath |
| 6,218,895 | B1 | 4/2001 | De |
| 6,221,724 | B1 | 4/2001 | Yu |
| 6,229,188 | B1 | 5/2001 | Aoki |
| 6,232,164 | B1 | 5/2001 | Tsai |
| 6,235,597 | B1 | 5/2001 | Miles |
| 6,245,618 | B1 | 6/2001 | An |
| 6,268,640 | B1 | 7/2001 | Park |
| 6,271,070 | B2 | 8/2001 | Kotani |
| 6,271,551 | B1 | 8/2001 | Schmitz |
| 6,288,429 | B1 | 9/2001 | Iwata |
| 6,297,132 | B1 | 10/2001 | Zhang |
| 6,300,177 | B1 | 10/2001 | Sundaresan |
| 6,313,489 | B1 | 11/2001 | Letavic |
| 6,319,799 | B1 | 11/2001 | Ouyang |
| 6,320,222 | B1 | 11/2001 | Forbes |
| 6,323,525 | B1 | 11/2001 | Noguchi |
| 6,326,666 | B1 | 12/2001 | Bernstein |
| 6,335,233 | B1 | 1/2002 | Cho |
| 6,358,806 | B1 | 3/2002 | Puchner |
| 6,380,019 | B1 | 4/2002 | Yu |
| 6,391,752 | B1 | 5/2002 | Colinge |
| 6,426,260 | B1 | 7/2002 | Hshieh |
| 6,426,279 | B1 | 7/2002 | Huster |
| 6,432,754 | B1 | 8/2002 | Assaderaghi |
| 6,444,550 | B1 | 9/2002 | Hao |
| 6,444,551 | B1 | 9/2002 | Ku |
| 6,449,749 | B1 | 9/2002 | Stine |
| 6,461,920 | B1 | 10/2002 | Shirahata |
| 6,461,928 | B2 | 10/2002 | Rodder |
| 6,472,278 | B1 | 10/2002 | Marshall |
| 6,482,714 | B1 | 11/2002 | Hieda |
| 6,489,224 | B1 | 12/2002 | Burr |
| 6,492,232 | B1 | 12/2002 | Tang |
| 6,500,739 | B1 | 12/2002 | Wang |
| 6,503,801 | B1 | 1/2003 | Rouse |
| 6,503,805 | B2 | 1/2003 | Wang |
| 6,506,640 | B1 | 1/2003 | Ishida |
| 6,518,623 | B1 | 2/2003 | Oda |
| 6,521,470 | B1 | 2/2003 | Lin |
| 6,534,373 | B1 | 3/2003 | Yu |
| 6,541,328 | B2 | 4/2003 | Whang |
| 6,541,829 | B2 | 4/2003 | Nishinohara |
| 6,548,842 | B1 | 4/2003 | Bulucea |
| 6,551,885 | B1 | 4/2003 | Yu |
| 6,552,377 | B1 | 4/2003 | Yu |
| 6,573,129 | B2 | 6/2003 | Hoke |
| 6,576,535 | B2 | 6/2003 | Drobny |
| 6,600,200 | B1 | 7/2003 | Lustig |

(56) References Cited

U.S. PATENT DOCUMENTS

| | | |
|---|---|---|
| 6,620,671 B1 | 9/2003 | Wang |
| 6,624,488 B1 | 9/2003 | Kim |
| 6,627,473 B1 | 9/2003 | Oikawa |
| 6,630,710 B1 | 10/2003 | Augusto |
| 6,660,605 B1 | 12/2003 | Liu |
| 6,662,350 B2 | 12/2003 | Fried |
| 6,667,200 B2 | 12/2003 | Sohn |
| 6,670,260 B1 | 12/2003 | Yu |
| 6,693,333 B1 | 2/2004 | Yu |
| 6,730,568 B2 | 5/2004 | Sohn |
| 6,737,724 B2 | 5/2004 | Hieda |
| 6,743,291 B2 | 6/2004 | Ang |
| 6,743,684 B2 | 6/2004 | Liu |
| 6,751,519 B1 | 6/2004 | Satya |
| 6,753,230 B2 | 6/2004 | Sohn |
| 6,760,900 B2 | 7/2004 | Rategh |
| 6,770,944 B2 | 8/2004 | Nishinohara |
| 6,787,424 B1 | 9/2004 | Yu |
| 6,797,553 B2 | 9/2004 | Adkisson |
| 6,797,602 B1 | 9/2004 | Kluth |
| 6,797,994 B1 | 9/2004 | Hoke |
| 6,808,004 B2 | 10/2004 | Kamm |
| 6,808,994 B1 | 10/2004 | Wang |
| 6,813,750 B2 | 11/2004 | Usami |
| 6,821,825 B2 | 11/2004 | Todd |
| 6,821,852 B2 | 11/2004 | Rhodes |
| 6,822,297 B2 | 11/2004 | Nandakumar |
| 6,831,292 B2 | 12/2004 | Currie |
| 6,835,639 B2 | 12/2004 | Rotondaro |
| 6,852,602 B2 | 2/2005 | Kanzawa |
| 6,852,603 B2 | 2/2005 | Chakravarthi |
| 6,881,641 B2 | 4/2005 | Wieczorek |
| 6,881,987 B2 | 4/2005 | Sohn |
| 6,891,439 B2 | 5/2005 | Jachne |
| 6,893,947 B2 | 5/2005 | Martinez |
| 6,900,519 B2 | 5/2005 | Cantell |
| 6,901,564 B2 | 5/2005 | Stine |
| 6,916,698 B2 | 7/2005 | Mocuta |
| 6,917,237 B1 | 7/2005 | Tschanz |
| 6,927,463 B2 | 8/2005 | Iwata |
| 6,928,128 B1 | 8/2005 | Sidiropoulos |
| 6,930,007 B2 | 8/2005 | Bu |
| 6,930,360 B2 | 8/2005 | Yamauchi |
| 6,957,163 B2 | 10/2005 | Ando |
| 6,963,090 B2 | 11/2005 | Passlack |
| 6,972,223 B2 | 12/2005 | Weimer |
| 6,995,397 B2 | 2/2006 | Yamashita |
| 7,002,214 B1 | 2/2006 | Boyd |
| 7,008,836 B2 | 3/2006 | Algotsson |
| 7,013,359 B1 | 3/2006 | Li |
| 7,015,546 B2 | 3/2006 | Herr |
| 7,015,741 B2 | 3/2006 | Tschanz |
| 7,022,559 B2 | 4/2006 | Barnak |
| 7,036,098 B2 | 4/2006 | Eleyan |
| 7,038,258 B2 | 5/2006 | Liu |
| 7,039,881 B2 | 5/2006 | Regan |
| 7,045,456 B2 | 5/2006 | Murto |
| 7,057,216 B2 | 6/2006 | Ouyang |
| 7,061,058 B2 | 6/2006 | Chakravarthi |
| 7,064,039 B2 | 6/2006 | Liu |
| 7,064,399 B2 | 6/2006 | Babcock |
| 7,071,103 B2 | 7/2006 | Chan |
| 7,078,325 B2 | 7/2006 | Curello |
| 7,078,776 B2 | 7/2006 | Nishinohara |
| 7,089,513 B2 | 8/2006 | Bard |
| 7,089,515 B2 | 8/2006 | Hanafi |
| 7,091,093 B1 | 8/2006 | Noda |
| 7,105,399 B1 | 9/2006 | Dakshina-Murthy |
| 7,109,099 B2 | 9/2006 | Tan |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch |
| 7,169,675 B2 | 1/2007 | Tan |
| 7,170,120 B2 | 1/2007 | Datta |
| 7,176,137 B2 | 2/2007 | Perng |
| 7,186,598 B2 | 3/2007 | Yamauchi |
| 7,189,627 B2 | 3/2007 | Wu |
| 7,199,430 B2 | 4/2007 | Babcock |
| 7,202,517 B2 | 4/2007 | Dixit |
| 7,208,354 B2 | 4/2007 | Bauer |
| 7,211,871 B2 | 5/2007 | Cho |
| 7,221,021 B2 | 5/2007 | Wu |
| 7,223,646 B2 | 5/2007 | Miyashita |
| 7,226,833 B2 | 6/2007 | White |
| 7,226,843 B2 | 6/2007 | Weber |
| 7,230,680 B2 | 6/2007 | Fujisawa |
| 7,235,822 B2 | 6/2007 | Li |
| 7,256,639 B1 | 8/2007 | Koniaris |
| 7,259,428 B2 | 8/2007 | Inaba |
| 7,260,562 B2 | 8/2007 | Czajkowski |
| 7,294,877 B2 | 11/2007 | Rueckes |
| 7,297,994 B2 | 11/2007 | Wieczorek |
| 7,301,208 B2 | 11/2007 | Handa |
| 7,304,350 B2 | 12/2007 | Misaki |
| 7,307,471 B2 | 12/2007 | Gammie |
| 7,312,500 B2 | 12/2007 | Miyashita |
| 7,323,754 B2 | 1/2008 | Ema |
| 7,332,439 B2 | 2/2008 | Lindert |
| 7,339,215 B2 | 3/2008 | Chidambaram |
| 7,348,629 B2 | 3/2008 | Chu |
| 7,354,833 B2 | 4/2008 | Liaw |
| 7,380,225 B2 | 5/2008 | Joshi |
| 7,398,497 B2 | 7/2008 | Sato |
| 7,402,207 B1 | 7/2008 | Besser |
| 7,402,872 B2 | 7/2008 | Murthy |
| 7,416,605 B2 | 8/2008 | Zollner |
| 7,427,788 B2 | 9/2008 | Li |
| 7,442,971 B2 | 10/2008 | Wirbeleit |
| 7,449,733 B2 | 11/2008 | Inaba |
| 7,462,908 B2 | 12/2008 | Bol |
| 7,469,164 B2 | 12/2008 | Du-Nour |
| 7,470,593 B2 | 12/2008 | Rouh |
| 7,485,536 B2 | 2/2009 | Jin |
| 7,487,474 B2 | 2/2009 | Ciplickas |
| 7,491,988 B2 | 2/2009 | Tolchinsky |
| 7,494,861 B2 | 2/2009 | Chu |
| 7,496,862 B2 | 2/2009 | Chang |
| 7,496,867 B2 | 2/2009 | Turner |
| 7,498,637 B2 | 3/2009 | Yamaoka |
| 7,501,324 B2 | 3/2009 | Babcock |
| 7,503,020 B2 | 3/2009 | Allen |
| 7,507,999 B2 | 3/2009 | Kusumoto |
| 7,514,766 B2 | 4/2009 | Yoshida |
| 7,521,323 B2 | 4/2009 | Surdeanu |
| 7,524,740 B1 | 4/2009 | Liu |
| 7,531,393 B2 | 5/2009 | Doyle |
| 7,531,836 B2 | 5/2009 | Liu |
| 7,538,364 B2 | 5/2009 | Twynam |
| 7,538,412 B2 | 5/2009 | Schulze |
| 7,553,717 B2 | 6/2009 | Chakravarthi |
| 7,562,233 B1 | 7/2009 | Sheng |
| 7,564,105 B2 | 7/2009 | Chi |
| 7,566,600 B2 | 7/2009 | Mouli |
| 7,569,456 B2 | 8/2009 | Ko |
| 7,586,322 B1 | 9/2009 | Xu |
| 7,592,241 B2 | 9/2009 | Takao |
| 7,595,243 B1 | 9/2009 | Bulucea |
| 7,598,142 B2 | 10/2009 | Ranade |
| 7,605,041 B2 | 10/2009 | Ema |
| 7,605,060 B2 | 10/2009 | Meunier-Beillard |
| 7,605,429 B2 | 10/2009 | Bernstein |
| 7,608,496 B2 | 10/2009 | Chu |
| 7,615,802 B2 | 11/2009 | Elpelt |
| 7,622,341 B2 | 11/2009 | Chudzik |
| 7,638,380 B2 | 12/2009 | Pearce |
| 7,642,140 B2 | 1/2010 | Bae |
| 7,644,377 B1 | 1/2010 | Saxe |
| 7,645,665 B2 | 1/2010 | Kubo |
| 7,651,920 B2 | 1/2010 | Siprak |
| 7,655,523 B2 | 2/2010 | Babcock |
| 7,673,273 B2 | 3/2010 | Madurawe |
| 7,675,126 B2 | 3/2010 | Cho |
| 7,675,317 B2 | 3/2010 | Perisetty |

(56) References Cited

U.S. PATENT DOCUMENTS

| | | |
|---|---|---|
| 7,678,631 B2 | 3/2010 | Murthy |
| 7,678,638 B2 | 3/2010 | Chu |
| 7,681,628 B2 | 3/2010 | Joshi |
| 7,682,887 B2 | 3/2010 | Dokumaci |
| 7,683,442 B1 | 3/2010 | Burr |
| 7,696,000 B2 | 4/2010 | Liu |
| 7,704,822 B2 | 4/2010 | Jeong |
| 7,704,844 B2 | 4/2010 | Zhu |
| 7,709,828 B2 | 5/2010 | Braithwaite |
| 7,723,750 B2 | 5/2010 | Zhu |
| 7,737,472 B2 | 6/2010 | Kondo |
| 7,741,138 B2 | 6/2010 | Cho |
| 7,741,200 B2 | 6/2010 | Cho |
| 7,745,270 B2 | 6/2010 | Shah |
| 7,750,374 B2 | 7/2010 | Capasso |
| 7,750,381 B2 | 7/2010 | Hokazono |
| 7,750,405 B2 | 7/2010 | Nowak |
| 7,750,682 B2 | 7/2010 | Bernstein |
| 7,755,144 B2 | 7/2010 | Li |
| 7,755,146 B2 | 7/2010 | Helm |
| 7,759,206 B2 | 7/2010 | Luo |
| 7,759,714 B2 | 7/2010 | Itoh |
| 7,761,820 B2 | 7/2010 | Berger |
| 7,795,677 B2 | 9/2010 | Bangsaruntip |
| 7,808,045 B2 | 10/2010 | Kawahara |
| 7,808,410 B2 | 10/2010 | Kim |
| 7,811,873 B2 | 10/2010 | Mochizuki |
| 7,811,881 B2 | 10/2010 | Cheng |
| 7,818,702 B2 | 10/2010 | Mandelman |
| 7,821,066 B2 | 10/2010 | Lebby |
| 7,829,402 B2 | 11/2010 | Matocha |
| 7,831,873 B1 | 11/2010 | Trimberger |
| 7,846,822 B2 | 12/2010 | Seebauer |
| 7,855,118 B2 | 12/2010 | Hoentschel |
| 7,859,013 B2 | 12/2010 | Chen |
| 7,863,163 B2 | 1/2011 | Bauer |
| 7,867,835 B2 | 1/2011 | Lee |
| 7,883,977 B2 | 2/2011 | Babcock |
| 7,888,205 B2 | 2/2011 | Herner |
| 7,888,747 B2 | 2/2011 | Hokazono |
| 7,895,546 B2 | 2/2011 | Lahner |
| 7,897,495 B2 | 3/2011 | Ye |
| 7,906,413 B2 | 3/2011 | Cardone |
| 7,906,813 B2 | 3/2011 | Kato |
| 7,910,419 B2 | 3/2011 | Fenouillet-Beranger |
| 7,919,791 B2 | 4/2011 | Flynn |
| 7,926,018 B2 | 4/2011 | Moroz |
| 7,935,984 B2 | 5/2011 | Nakano |
| 7,941,776 B2 | 5/2011 | Majumder |
| 7,945,800 B2 | 5/2011 | Gomm |
| 7,948,008 B2 | 5/2011 | Liu |
| 7,952,147 B2 | 5/2011 | Ueno |
| 7,960,232 B2 | 6/2011 | King |
| 7,960,238 B2 | 6/2011 | Kohli |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell |
| 7,989,900 B2 | 8/2011 | Haensch |
| 7,994,573 B2 | 8/2011 | Pan |
| 8,004,024 B2 | 8/2011 | Furukawa |
| 8,012,827 B2 | 9/2011 | Yu |
| 8,029,620 B2 | 10/2011 | Kim |
| 8,039,332 B2 | 10/2011 | Bernard |
| 8,046,598 B2 | 10/2011 | Lee |
| 8,048,791 B2 | 11/2011 | Hargrove |
| 8,048,810 B2 | 11/2011 | Tsai |
| 8,051,340 B2 | 11/2011 | Cranford, Jr. |
| 8,053,340 B2 | 11/2011 | Colombeau |
| 8,063,466 B2 | 11/2011 | Kurita |
| 8,067,279 B2 | 11/2011 | Sadra |
| 8,067,280 B2 | 11/2011 | Wang |
| 8,067,302 B2 | 11/2011 | Li |
| 8,076,719 B2 | 12/2011 | Zeng |
| 8,097,529 B2 | 1/2012 | Krull |
| 8,103,983 B2 | 1/2012 | Agarwal |
| 8,105,891 B2 | 1/2012 | Yeh |
| 8,106,424 B2 | 1/2012 | Schruefer |
| 8,106,481 B2 | 1/2012 | Rao |
| 8,110,487 B2 | 2/2012 | Griebenow |
| 8,114,761 B2 | 2/2012 | Mandrekar |
| 8,119,482 B2 | 2/2012 | Bhalla |
| 8,120,069 B2 | 2/2012 | Hynecek |
| 8,129,246 B2 | 3/2012 | Babcock |
| 8,129,797 B2 | 3/2012 | Chen |
| 8,134,159 B2 | 3/2012 | Hokazono |
| 8,143,120 B2 | 3/2012 | Kerr |
| 8,143,124 B2 | 3/2012 | Challa |
| 8,143,678 B2 | 3/2012 | Kim |
| 8,148,774 B2 | 4/2012 | Mori |
| 8,163,619 B2 | 4/2012 | Yang |
| 8,169,002 B2 | 5/2012 | Chang |
| 8,170,857 B2 | 5/2012 | Joshi |
| 8,173,499 B2 | 5/2012 | Chung |
| 8,173,502 B2 | 5/2012 | Yan |
| 8,176,461 B1 | 5/2012 | Trimberger |
| 8,178,430 B2 | 5/2012 | Kim |
| 8,179,530 B2 | 5/2012 | Levy |
| 8,183,096 B2 | 5/2012 | Wirbeleit |
| 8,183,107 B2 | 5/2012 | Mathur |
| 8,185,865 B2 | 5/2012 | Gupta |
| 8,187,959 B2 | 5/2012 | Pawlak |
| 8,188,542 B2 | 5/2012 | Yoo |
| 8,196,545 B2 | 6/2012 | Kurosawa |
| 8,201,122 B2 | 6/2012 | Dewey, III |
| 8,214,190 B2 | 7/2012 | Joshi |
| 8,217,423 B2 | 7/2012 | Liu |
| 8,225,255 B2 | 7/2012 | Ouyang |
| 8,227,307 B2 | 7/2012 | Chen |
| 8,236,661 B2 | 8/2012 | Dennard |
| 8,239,803 B2 | 8/2012 | Kobayashi |
| 8,247,300 B2 | 8/2012 | Babcock |
| 8,255,843 B2 | 8/2012 | Chen |
| 8,258,026 B2 | 9/2012 | Bulucea |
| 8,266,567 B2 | 9/2012 | El Yahyaoui |
| 8,286,180 B2 | 10/2012 | Foo |
| 8,288,798 B2 | 10/2012 | Passlack |
| 8,299,562 B2 | 10/2012 | Li |
| 8,324,059 B2 | 12/2012 | Guo |
| 8,723,617 B2 | 5/2014 | Caspers |
| 8,748,270 B1 * | 6/2014 | Shifren ............ H01L 29/66659 257/E21.443 |
| 2001/0014495 A1 | 8/2001 | Yu |
| 2002/0042184 A1 | 4/2002 | Nandakumar |
| 2003/0006415 A1 | 1/2003 | Yokogawa |
| 2003/0047763 A1 | 3/2003 | Hieda |
| 2003/0122203 A1 | 7/2003 | Nishinohara |
| 2003/0173626 A1 | 9/2003 | Burr |
| 2003/0183856 A1 | 10/2003 | Wieczorek |
| 2003/0215992 A1 | 11/2003 | Sohn |
| 2004/0075118 A1 | 4/2004 | Heinemann |
| 2004/0075143 A1 | 4/2004 | Bae |
| 2004/0084731 A1 | 5/2004 | Matsuda |
| 2004/0087090 A1 | 5/2004 | Grudowski |
| 2004/0126947 A1 | 7/2004 | Sohn |
| 2004/0175893 A1 | 9/2004 | Vatus |
| 2004/0180488 A1 | 9/2004 | Lee |
| 2005/0106824 A1 | 5/2005 | Alberto |
| 2005/0116282 A1 | 6/2005 | Pattanayak |
| 2005/0250289 A1 | 11/2005 | Babcock |
| 2005/0280075 A1 | 12/2005 | Ema |
| 2006/0022270 A1 | 2/2006 | Boyd |
| 2006/0024876 A1 | 2/2006 | Chidambaram |
| 2006/0049464 A1 | 3/2006 | Rao |
| 2006/0068555 A1 | 3/2006 | Huilong |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock |
| 2006/0203581 A1 | 9/2006 | Joshi |
| 2006/0220114 A1 | 10/2006 | Miyashita |
| 2006/0223248 A1 | 10/2006 | Venugopal |
| 2007/0040222 A1 | 2/2007 | Van Camp |
| 2007/0117326 A1 | 5/2007 | Tan |

(56) References Cited

U.S. PATENT DOCUMENTS

| | | |
|---|---|---|
| 2007/0158790 A1 | 7/2007 | Rao |
| 2007/0212861 A1 | 9/2007 | Chidambarrao |
| 2007/0238253 A1 | 10/2007 | Tucker |
| 2008/0067589 A1 | 3/2008 | Ito |
| 2008/0108208 A1 | 5/2008 | Arevalo |
| 2008/0169493 A1 | 7/2008 | Lee |
| 2008/0169516 A1 | 7/2008 | Chung |
| 2008/0194069 A1 | 8/2008 | Surdeanu |
| 2008/0197439 A1 | 8/2008 | Goerlach |
| 2008/0199999 A1 | 8/2008 | Weijtmans |
| 2008/0227250 A1 | 9/2008 | Ranade |
| 2008/0237661 A1 | 10/2008 | Ranade |
| 2008/0258198 A1 | 10/2008 | Bojarczuk |
| 2008/0272409 A1 | 11/2008 | Sonkusale |
| 2009/0057746 A1 | 3/2009 | Sugll |
| 2009/0079008 A1 | 3/2009 | Nandakumar |
| 2009/0081858 A1 | 3/2009 | Qin |
| 2009/0108350 A1 | 4/2009 | Cai |
| 2009/0134468 A1 | 5/2009 | Tsuchiya |
| 2009/0179280 A1 | 7/2009 | Kohli |
| 2009/0224319 A1 | 9/2009 | Kohli |
| 2009/0278209 A1 | 11/2009 | Noda |
| 2009/0286367 A1 | 11/2009 | Krull |
| 2009/0302388 A1 | 12/2009 | Cai |
| 2009/0309140 A1 | 12/2009 | Khamankar |
| 2009/0311837 A1 | 12/2009 | Kapoor |
| 2009/0321849 A1 | 12/2009 | Miyamura |
| 2010/0012988 A1 | 1/2010 | Yang |
| 2010/0038724 A1 | 2/2010 | Anderson |
| 2010/0078729 A1 | 4/2010 | Fukutome |
| 2010/0100856 A1 | 4/2010 | Mittal |
| 2010/0133624 A1 | 6/2010 | Nandakumar |
| 2010/0148153 A1 | 6/2010 | Hudait |
| 2010/0149854 A1 | 6/2010 | Vora |
| 2010/0187641 A1 | 7/2010 | Zhu |
| 2010/0207182 A1 | 8/2010 | Paschal |
| 2010/0270600 A1 | 10/2010 | Inukai |
| 2010/0276761 A1 | 11/2010 | Tung |
| 2011/0059588 A1 | 3/2011 | Kang |
| 2011/0073961 A1 | 3/2011 | Dennard |
| 2011/0074498 A1 | 3/2011 | Thompson |
| 2011/0079860 A1 | 4/2011 | Verhulst |
| 2011/0079861 A1 | 4/2011 | Shifren |
| 2011/0095811 A1 | 4/2011 | Chi |
| 2011/0147828 A1 | 6/2011 | Murthy |
| 2011/0169082 A1 | 7/2011 | Zhu |
| 2011/0175140 A1 | 7/2011 | Taylor |
| 2011/0175170 A1 | 7/2011 | Wang |
| 2011/0180880 A1 | 7/2011 | Chudzik |
| 2011/0193164 A1 | 8/2011 | Zhu |
| 2011/0212590 A1 | 9/2011 | Wu |
| 2011/0230039 A1 | 9/2011 | Mowry |
| 2011/0242921 A1 | 10/2011 | Tran |
| 2011/0248352 A1 | 10/2011 | Shifren |
| 2011/0294278 A1 | 12/2011 | Eguchi |
| 2011/0309447 A1 | 12/2011 | Arghavani |
| 2012/0021594 A1 | 1/2012 | Gurtej |
| 2012/0034745 A1 | 2/2012 | Colombeau |
| 2012/0056275 A1 | 3/2012 | Cai |
| 2012/0065920 A1 | 3/2012 | Nagumo |
| 2012/0108050 A1 | 5/2012 | Chen |
| 2012/0132998 A1 | 5/2012 | Kwon |
| 2012/0138953 A1 | 6/2012 | Cai |
| 2012/0146155 A1 | 6/2012 | Hoentschel |
| 2012/0161210 A1 | 6/2012 | Heinrich |
| 2012/0167025 A1 | 6/2012 | Gillespie |
| 2012/0187491 A1 | 7/2012 | Zhu |
| 2012/0190177 A1 | 7/2012 | Kim |
| 2012/0223363 A1 | 9/2012 | Kronholz |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO 2005/093831 | 10/2005 |
| WO | WO 2011/062788 | 5/2011 |

OTHER PUBLICATIONS

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 µm CMOS with a Step Channel Profile Formed by Ultra High Vacuum CVD and In-Situ Doped Ions", Proceedings of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

Abiko, H et al., "A Channel Engineering Combined with Channel Epitaxy Optimization and TED Suppression for 0.15µm n-n Gate CMOS Technology", 1995 Symposium on VLSI Technology Digest of Technical Papers, pp. 23-24.

Chau, R et al., "A 50nm Depleted-Substrate CMOS Transistor (DST)", Electron Device Meeting 2001, IEDM Technical Digest, IEEE International, pp. 29.1.1-29.1.4.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

(56) References Cited

OTHER PUBLICATIONS

Holland, Ow and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462.

Lavéant, P. "Incorporation, Diffusion and Agglomeration of Carbon in Silicon", Solid State Phenomena, vol. 82-84, pp. 189-194, 2002.

Noda, K et al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-µm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116.

Werner, P et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

* cited by examiner

METHOD FOR FABRICATING A TRANSISTOR DEVICE WITH A TUNED DOPANT PROFILE

This application is a continuation of U.S. application Ser. No. 15/053,099 filed Feb. 25, 2016 and entitled "Method for Fabricating a Transistor Device With a Tuned Dopant Profile", which is a divisional of U.S. application Ser. No. 13/828,262 filed Mar. 14, 2013 and entitled "Method for Fabricating a Transistor Device With a Tuned Dopant Profile", now U.S. Pat. No. 9,299,801, the contents of which are herein incorporated by reference in their entirety.

TECHNICAL FIELD

The present disclosure relates in general to semiconductor fabrication processes and more particularly to a method for fabricating a transistor device with a tuned dopant profile.

BACKGROUND

Cost effective semiconductor electronic manufacturing requires transistor structures and manufacturing processes that are reliable at nanometer scales and that do not require expensive or unavailable tools or process control conditions for the design or manufacture. While it is difficult to balance the many variables that control transistor electrical performance, finding suitable transistor dopant structures with an associated manufacturing technique that results in acceptable electrical characteristics such as charge carrier mobility, threshold voltage levels, and junction leakage are a key aspect of such commercially useful transistors.

BRIEF DESCRIPTION OF THE DRAWINGS

For a more complete understanding of the present disclosure, reference is now made to the following description taken in conjunction with the accompanying drawings, wherein like reference numerals represent like parts, in which.

DETAILED DESCRIPTION

Figures 1A, 1B, 1C:
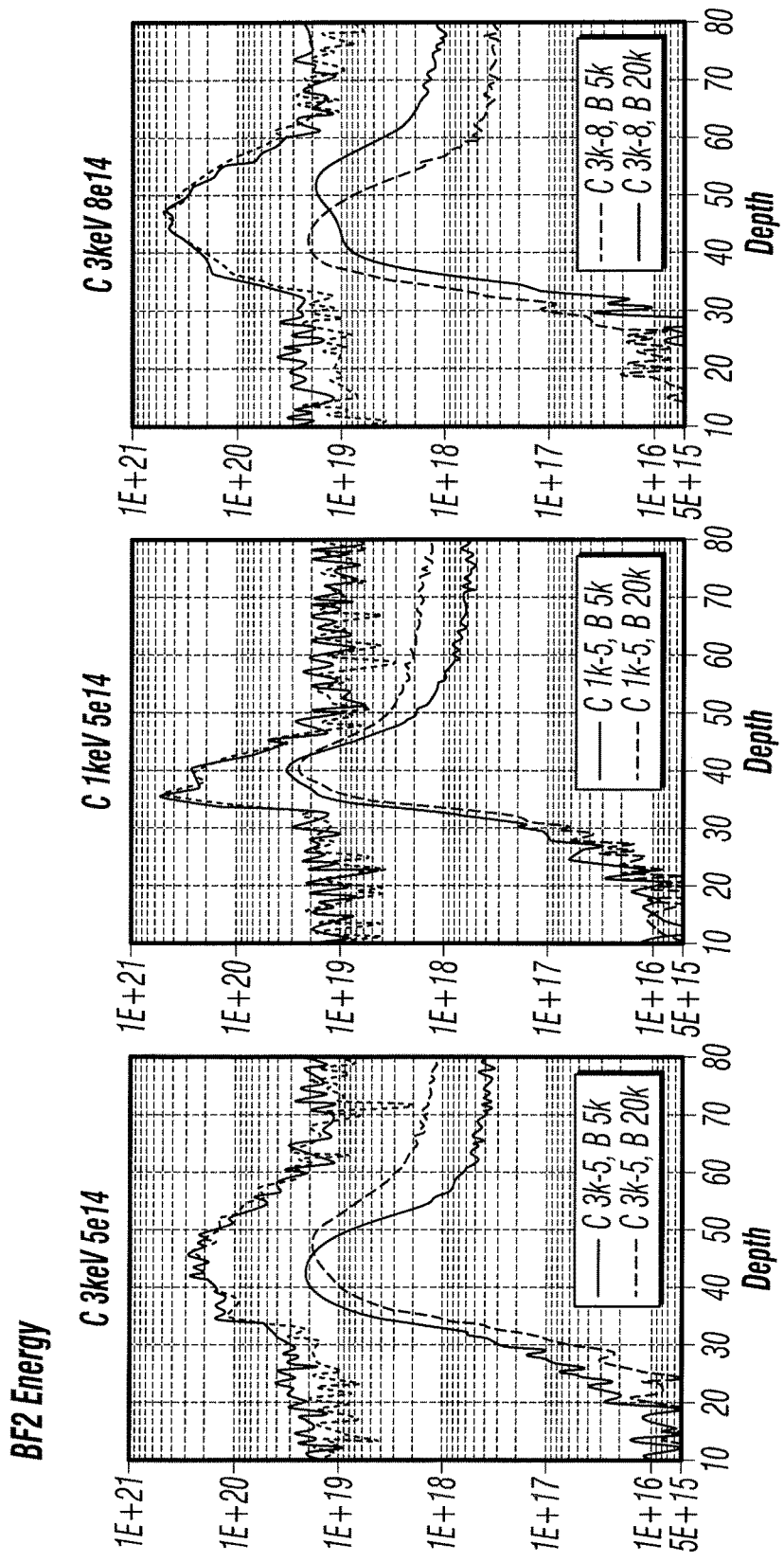
FIGS. 1A-1C illustrate how a carbon implant may be used to adjust a dopant profile of a boron implant.

A Deeply Depleted Channel (DDC) transistor can use, among other things, dopants in preselected concentrations and located specific areas a distance below the top surface of the substrate to define a depletion zone and establish a threshold voltage during transistor operation. This can result in a transistor having improved electrical parameters including threshold voltage variation among transistors and reduced power requirements. One quality goal of a DDC transistor is to form the doped regions in such a manner as to inhibit the migration of the dopants outside of the desired locations.

A DDC transistor typically includes both a highly doped region formed in a semiconductor substrate below a gate, called the screening layer, that functions to define the extent of the depletion region below the gate in operation, and an undoped epitaxially grown channel on the highly doped region extending between a source and a drain of the transistor. In addition, a threshold voltage set layer may be positioned between the undoped channel and the screening layer and may alternatively contact or be separated from the screening layer and/or the undoped channel. This threshold voltage set layer is used to finely adjust or tune the threshold voltage of individual or blocks of transistors. The screening layer and/or the threshold voltage set layer can be implanted into the semiconductor substrate, separately grown as a blanket or as selective epitaxial layers on the semiconductor substrate and doped by controlled implants, or by substitutional doped deposition. The threshold voltage set layer may also be formed by performing a controlled diffusion from the screening layer. An anti-punchthrough layer may also underlie the screening layer and may be formed by implantation into the semiconductor substrate or by diffusion from the screening layer. As compared to conventional doped channel transistors, such DDC transistors can be more closely matched in device characteristics, in part because they have reduced channel random dopant fluctuations that can result in variable threshold voltage set points. Other embodiments of DDC transistors may include a slightly doped channel, whether by way of channel dopants distributed throughout or halo implants or other forms of channel doping. Further examples of a DDC transistor structure and manufacture are disclosed in U.S. Pat. No. 8,273,617 titled ELECTRONIC DEVICES AND SYSTEMS, AND METHODS FOR MAKING AND USING THE SAME by Scott E. Thompson et al., as well as U.S. patent application Ser. No. 12/971,884, filed on Dec. 17, 2010 titled LOW POWER SEMICONDUCTOR TRANSISTOR STRUCTURE AND METHOD OF FABRICATION THEREOF and U.S. patent application Ser. No. 12/971,955 filed on Dec. 17, 2010 titled TRANSISTOR WITH THRESHOLD VOLTAGE SET NOTCH AND METHOD OF FABRICATION THEREOF, the respective contents of which are incorporated by reference herein.

Thermal cycles in the fabrication process can lead to diffusion of the screening and threshold voltage set layer materials particularly when the materials used tend to be mobile. It is desirable to prevent screening layer and threshold voltage set layer materials from unwanted diffusion into the undoped channel layer. A method of reducing dopant migration is to introduce a dopant migration resistant material, such as carbon, to further limit unwanted dopant migration.

As an example, boron is preferably used for NMOS transistor fabrication. For a DDC NMOS transistor, a boron implant may be used for a screening layer and for the optional threshold voltage set layer. Implanted boron is widely known to diffuse during device fabrication, especially in thermal cycles of 900° C. or more. To avoid unwanted diffusion of boron, carbon may be added to the crystalline lattice. It is thought that carbon takes substitutional positions in the crystalline structure to limit available pathways for the movement of boron. There may be a pre-amorphization implant using germanium followed by a recrystallization anneal to enhance the effectiveness of the added carbon. The use of carbon addition to inhibit migration of dopants works effectively in a silicon crystalline substrate, and can be effective in other semiconducting substrates as well. Another benefit to using carbon implant is in its ability to tune the dopant profile of the boron.

FIGS. 1A-1C show by way of example how a carbon implant may be used to adjust a dopant profile of a boron used for a screening layer or a threshold voltage set layer of the DDC transistor. Throughout FIGS. 1A-1C, the dose of the boron implant is constant at $3.5 \times 10^{13}$ atoms/cm$^2$ to achieve a peak concentration as shown on the charts. In each of FIGS. 1A-1C, two dopant profiles are shown, one at a BF2 implant energy of 5 keV and one at an implant energy of 20 keV. Though results are shown for BF2, the effects shown herein apply to a boron implant as well. FIG. 1A shows the effect of a carbon implant at an implant energy of 3 keV and an implant dose of $5 \times 10^{14}$ atoms/cm$^2$ on the boron dopant profile. FIG. 1B shows the effect of a carbon implant at an implant energy of 1 keV and an implant dose of $5 \times 10^{14}$ atoms/cm$^2$ on the boron dopant profile. FIG. 1C shows the effect of a carbon implant at an implant energy of 3 keV and an implant dose of $8 \times 10^{14}$ atoms/cm$^2$ on the boron dopant profile.

As shown in FIGS. 1A-1C, the amount of implant energy for the carbon implant has a visible effect on the resultant boron dopant profile. For instance, as seen in FIG. 1B, a lower carbon implant energy, for instance, 1 keV, produces a sharper and higher peak in the boron dopant profile than for a carbon implant energy of 3 keV, where, as seen in FIGS. 1A and 1C, the boron dopant profile is more spread out. Moreover, boron dopant profile peak height and location may also be changed even when the carbon implant remains constant and the BF2 implant energy is adjusted. Another characteristic illustrated by FIGS. 1A-1C is that a tail of the dopant profile is affected by an amount of implant energy for the BF2 implant. Degradation of the dopant profile tail at lower implant energies for the BF2 implant may lead to higher drain induced barrier lowering (DIBL), greater short channel effects, and less threshold voltage response.

Figure 2A:
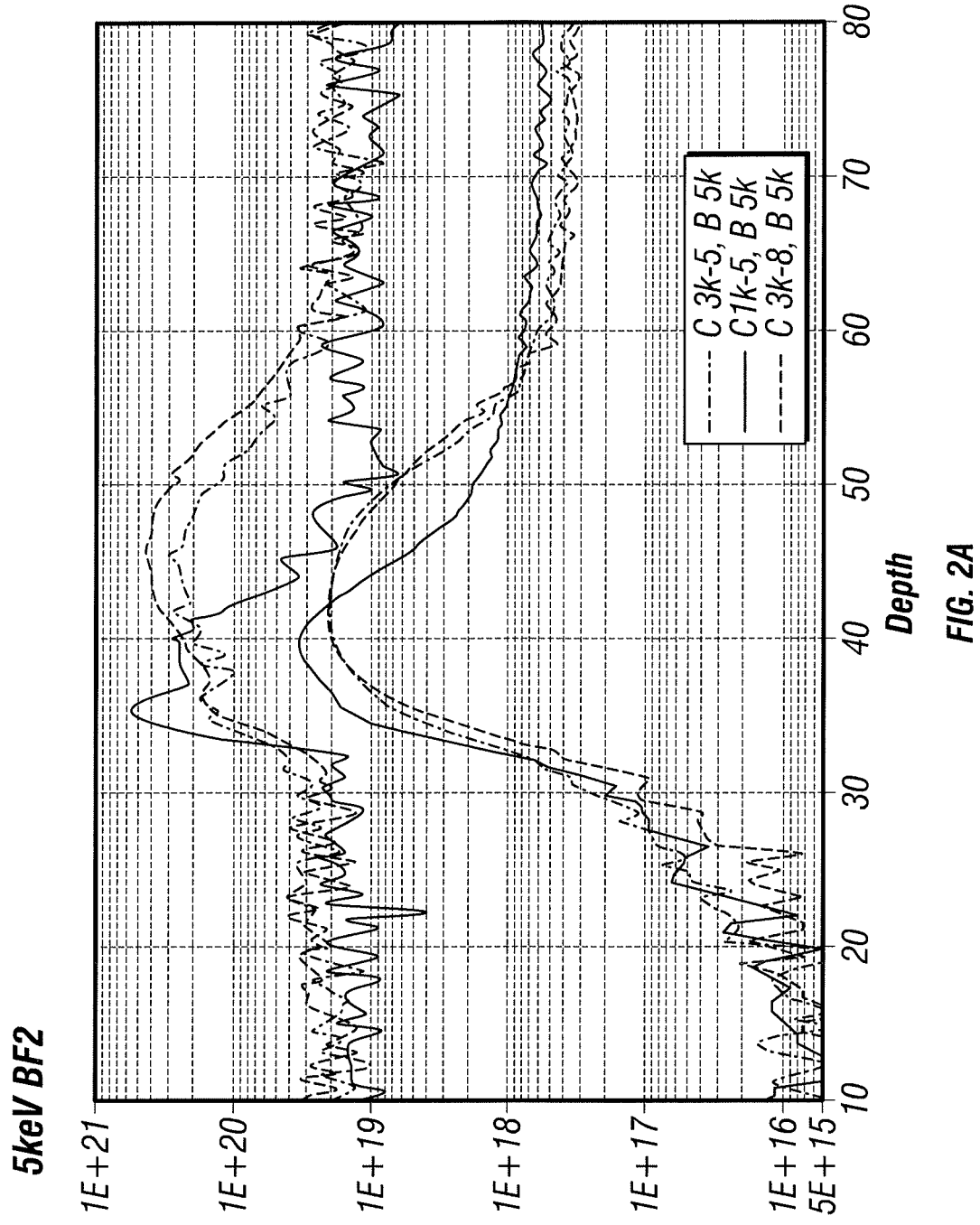
FIGS. 2A-2B illustrate examples of how a position and height of a peak of the dopant profile can be adjusted through a change in the carbon implant.
Figure 2B:
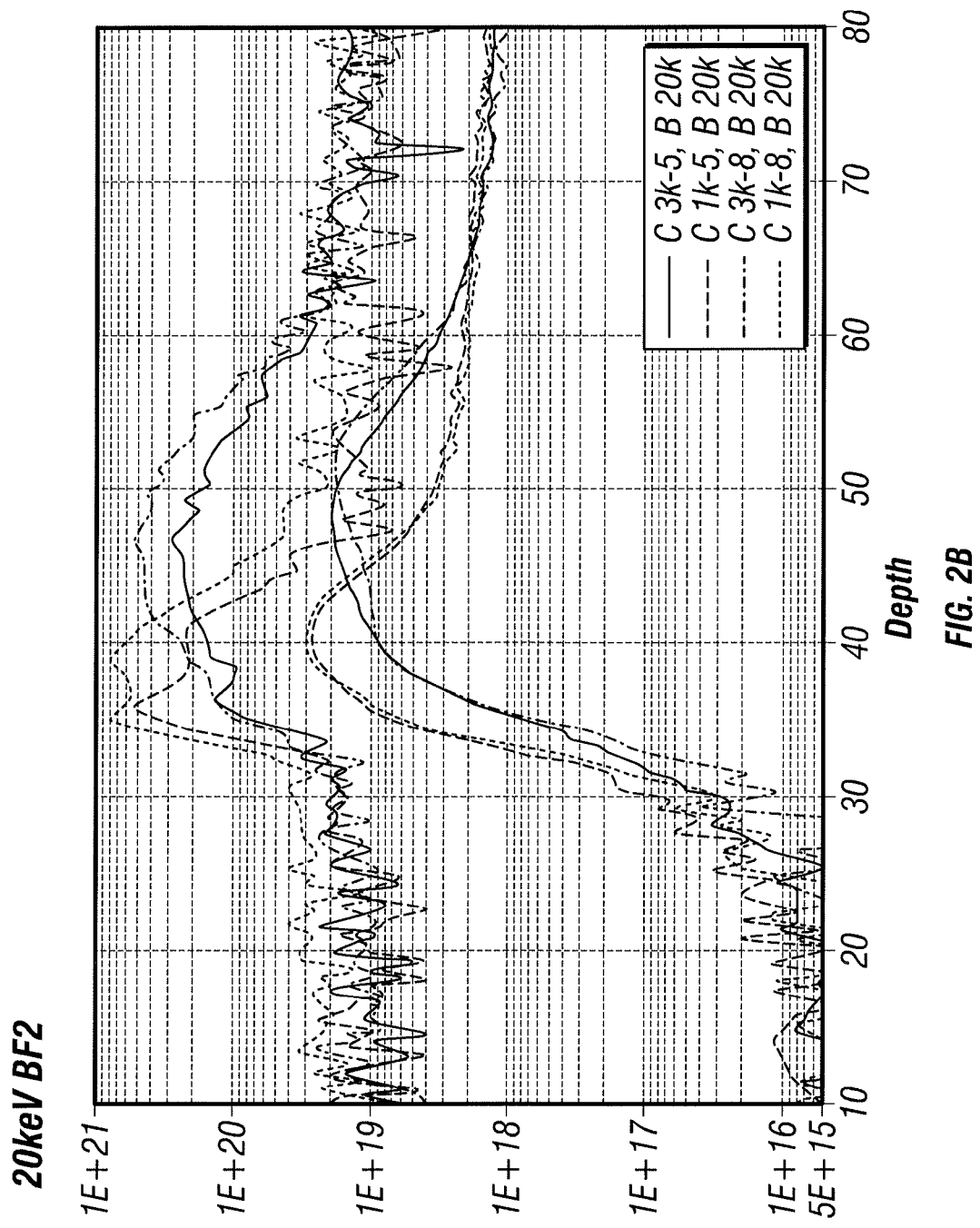

FIGS. 2A-2B show examples of how a position and height of a peak of the boron dopant profile can be adjusted through a change in the carbon implant. The example of FIG. 2A uses BF2 as the dopant material implanted at an energy of 5 keV and a dopant implant dose of $3.5 \times 10^{13}$ atoms/cm$^2$. The peak of the boron dopant profile is sharper and higher and occurs at a shallower depth for a carbon implant energy of 1 keV as compared to 3 keV. As a result, fine tuning of the boron dopant profile is achieved through variations in carbon implant parameters, with the carbon energy being tied to the sharpness of the peak for the boron profile. A lower carbon energy is used to attain a sharper boron peak. A lower carbon energy also causes the peak of the boron to be shallower and higher in concentration than for a higher carbon energy. Changes in carbon implant dose has a negligible effect on the boron dopant profile in this example, with very slight increases in peak height and sharpness of the dopant profile occurring at increased doses of the carbon implant. As a result, the boron dopant profile is more affected by carbon implant energy than carbon dopant concentration. However, increased carbon dopant concentration may protect the screening layer and the threshold voltage set layer from encroachment of subsequently formed lightly doped drain or source/drain extension regions.

The example of FIG. 2B uses BF2 as the dopant material implanted at an energy of 20 keV and a dopant implant dose of $3.5 \times 10^{13}$ atoms/cm$^2$. Similar changes in location and height of the peak of the dopant profile are achieved relative to carbon implant energy as similarly shown in FIG. 2A. Note that, as indicated in FIG. 2A-2B, a dual implant of carbon can be used to attain a dual peak profile for the boron. A lower-energy carbon, for instance, at an energy of about 1 keV, can be combined with a higher energy carbon, for instance, at an energy of about 3 keV, to produce a dual peak profile for the boron of a first, sharper, shallower peak and a second, wider, deeper peak. Finer dopant profile tuning can be made with modifications to the carbon dose.

FIGS. 3A-3F show an example of the changes that may take place in a transistor channel structure 300 during a fabrication process to produce the dopant profiles of FIGS. 1A-1C and 2A-2B. The process begins in FIG. 3A with a mask 302 formed on a semiconductor substrate 304 (preferably bulk silicon) to define an opening constituting an implant region 306. In one embodiment for an NMOS transistor device, a p-type material (for discussion purposes Boron or BF2) is implanted in the opening 306, at approximately 100-250 keV at doses in the range of $1 \times 10^{13}$ to $5 \times 10^{13}$ atoms/cm$^2$, to form a well 308.

Figure 3A:
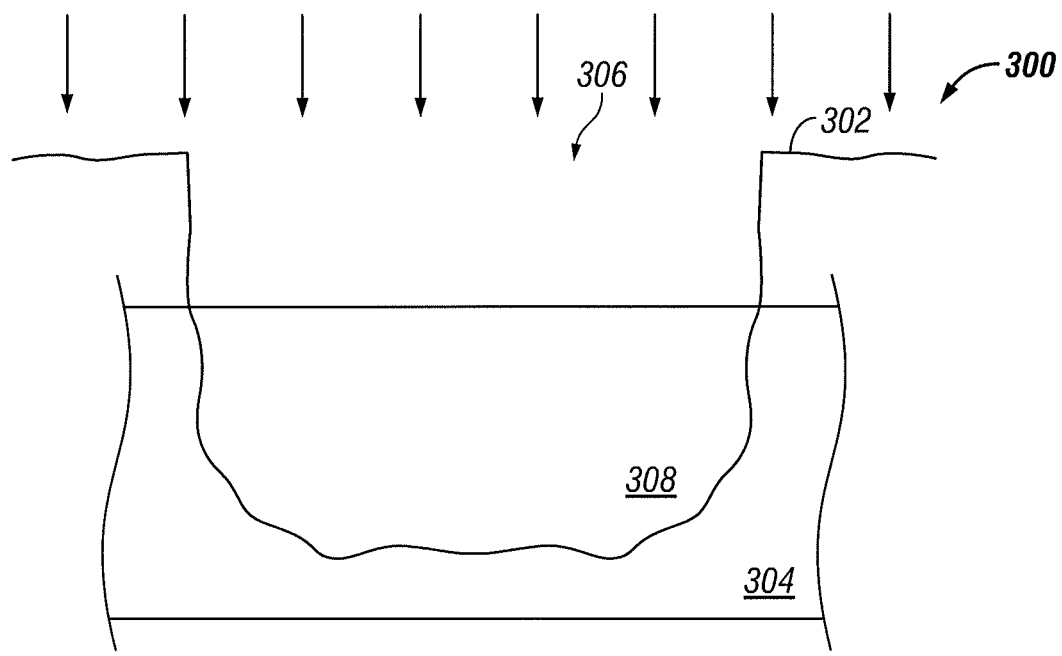
FIGS. 3A-3F illustrate changes in a transistor structure during a fabrication process to produce the dopant profiles of FIGS. 1A-1C and 2A-2B.
Figure 3B:
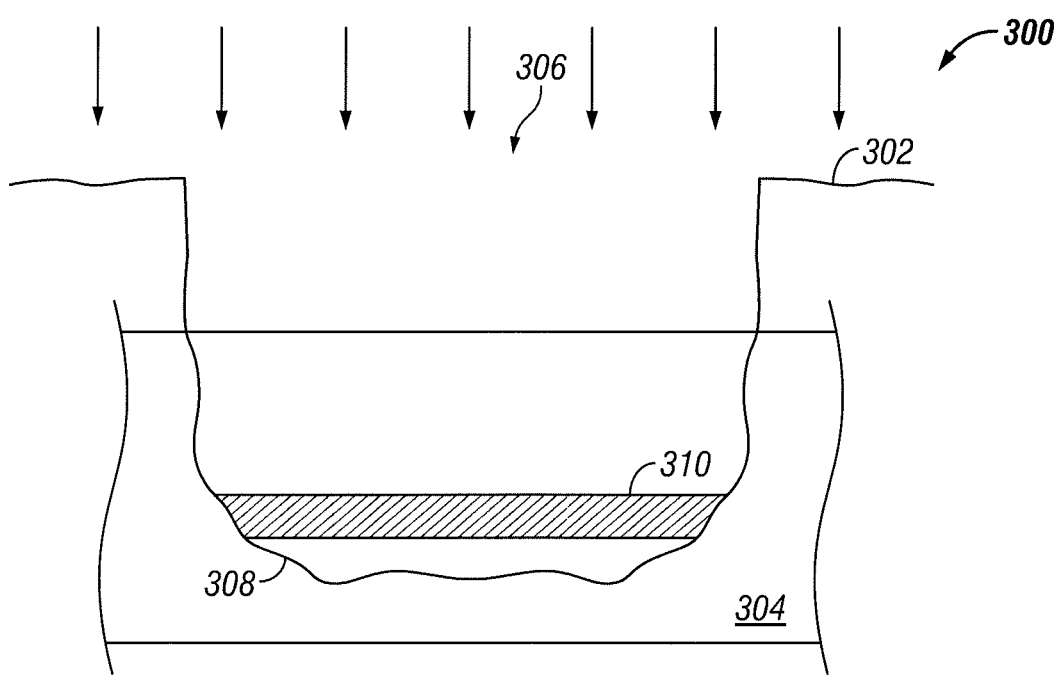

In FIG. 3B, an optional anti-punchthrough layer 310 comprising a p-type material may be implanted into opening 306. An example implant condition for anti-punchthrough layer 310 may include an implant energy of 30 to 50 keV and a dopant concentration of about 0.8 to $3.0 \times 10^{13}$ atoms/cm$^2$.

Figure 3C:
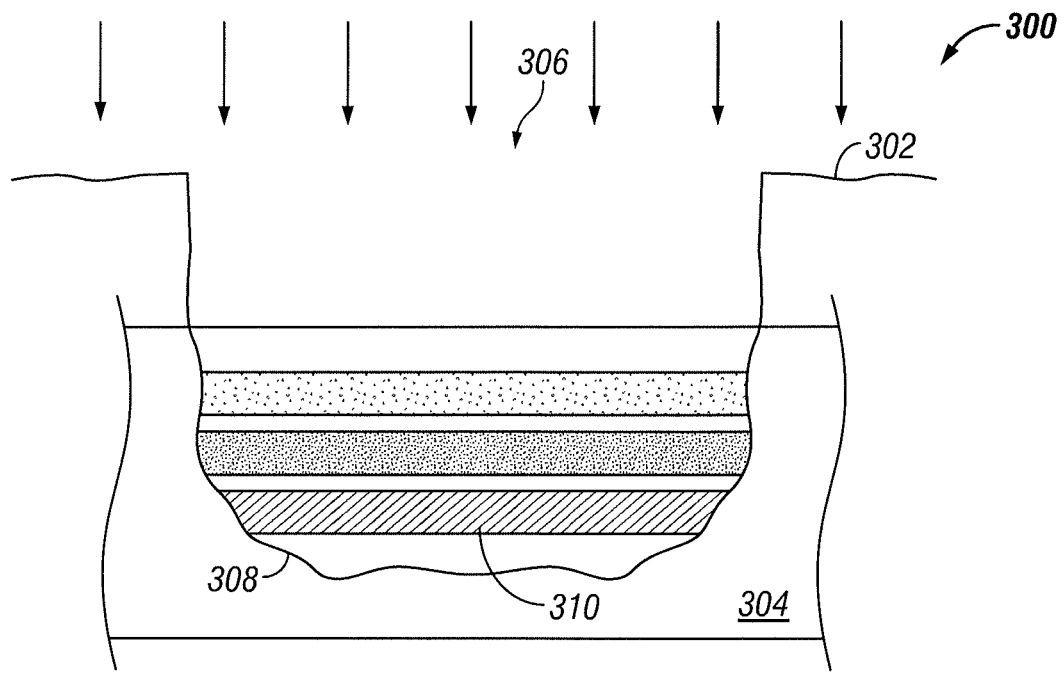

In FIG. 3C, dopant migration resistant material such as carbon is implanted into opening 306. An example process condition may include a germanium implant at an implant energy of 30 to 50 keV and a dopant implant dose of 4 to $6 \times 10^{14}$ atoms/cm$^2$. Multiple carbon implants may be performed for further dopant profile tuning as desired. For instance, each carbon implant can correspond respectively to one or more of anti-punchthrough layer 310 and a subsequently formed screening layer and a subsequently formed threshold voltage set layer. The process conditions for the carbon implants may include those discussed above, with energy selections tailored to tune the dopant profile of the anti-punchthrough layer 310, the screening layer, the threshold voltage set layer and any other desired profiles. The carbon implant may be performed once for all dopant profile tunings, or may be performed in steps specifically matched to steps for one or more of the dopant regions. Notably, the dopant profile shape for one or more screening layers and if present, the threshold voltage set layer are designed for the transistor to meet its parametric requirements. Therefore, implementing a process that matches an appropriate carbon implant energy to targeted dopant profile shapes is beneficial for achieving structural and device metric goals for the transistor. Example carbon implant conditions may include an implant energy of 0.8 to 8 keV and a dopant implant dose of $3 \times 10^{13}$ to $8 \times 10^{14}$ atoms/cm$^2$. A particularly shallow carbon implant may serve an additional benefit to contain the profile of the to-be-formed source/drain extensions (shown as 322, 324 in FIG. 3F). A deeper carbon implant may be used to control the shape of a more deeply implanted dopant, for example anti-punchthrough layer 310. The carbon implant conditions are selected to place a peak of the dopant profile of the anti-punchthrough layer 310, the screening layer, and the threshold voltage set layer at a desired location and height.

After the germanium and carbon implants, transistor structure 300 is usually subjected to one or more annealing processes. Example annealing processes include baking transistor structure 300 at a temperature of 600 to 700° C. for 80 to 200 seconds. A spike anneal may also be performed at an example temperature of 900 to 1100° C. for a duration of less than 1 second. The anneal processes are selected and performed to recrystallize the semiconductor substrate while suppressing diffusion of implanted dopants.

Figure 3D:
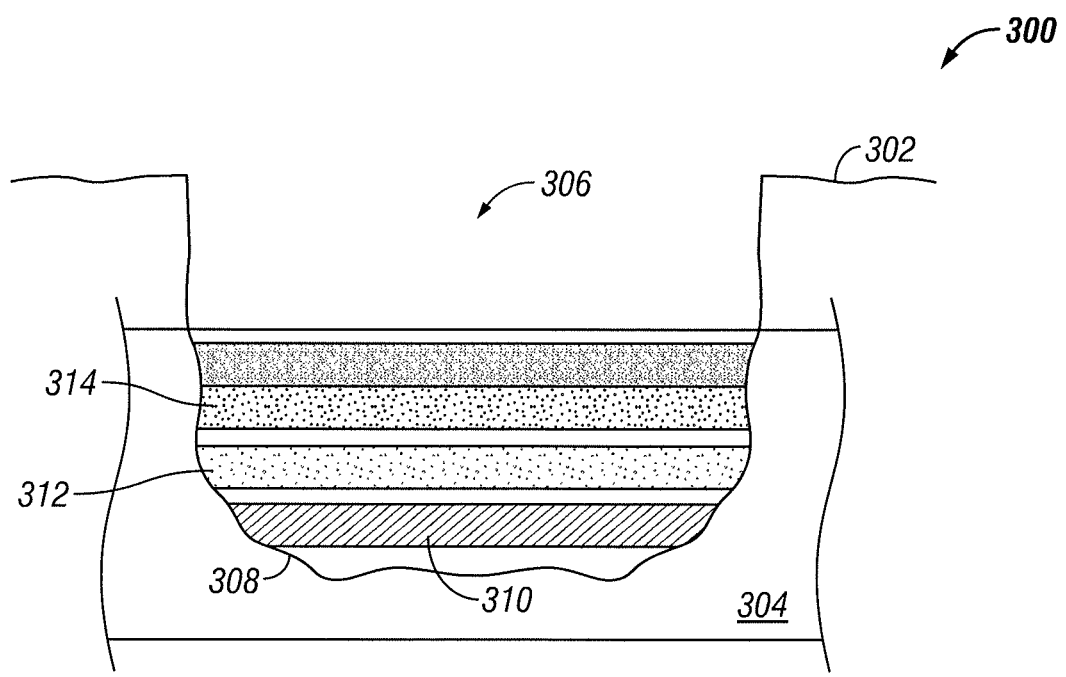

In FIG. 3D, a screening layer 312 and a threshold voltage set layer 314 are implanted into implant region 306. In an alternative process, anti-punchthrough layer 310 may also be implanted at this time instead of prior to the germanium implant as stated above. Example implant conditions include those discussed above where screening layer 312 may be implanted with a p-type material at an implant energy of 10 to 30 keV and a dopant implant dose of 2 to $5\times10^{13}$ atoms/cm$^2$. Threshold voltage set layer 314 may be implanted with a p-type material at an implant energy of 3 to 20 keV and a dopant implant dose of 1 to $4\times10^{13}$ atoms/cm$^2$. In alternative embodiments, screening layer 312 may have a higher dopant concentration, approximately the same, or lower dopant concentration than that of threshold voltage set layer 314 so that the screening layer 312 may be below or above the threshold voltage set layer 314. The desired peak sharpness of the screening layer 312 and threshold voltage set layer 314 are modulated by setting the carbon implant energy that matches the desired outcome, that is a lower carbon implant energy resulting in sharper, higher peaks with a more narrow profile. Typically, the dopant concentration of the anti-punchthrough layer 310 is lower than both the screening layer 312 and threshold voltage set layer 314. Implantation of screening layer 312 and threshold voltage set layer 314 may be performed in separate implant steps or as a single continuous step through dynamic adjustment of the process conditions.

Figure 3E:
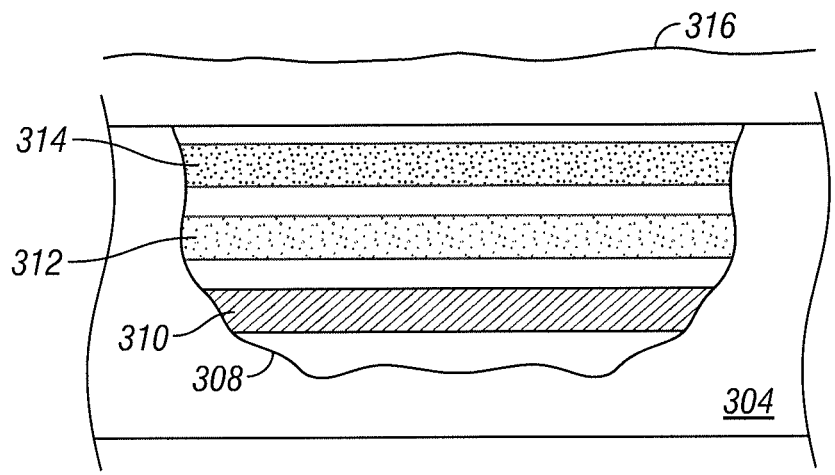

In FIG. 3E, following screening layer 312 and threshold voltage set layer 314 implantation, transistor structure 300 may be subject to one or more anneal processes as discussed above in order to further prevent diffusion of the dopants in these layers. Mask 302 is removed and a blanket undoped channel layer 316 may then be epitaxially grown across a plurality of transistor structures 300 on a single die (not shown).

Figure 3F:
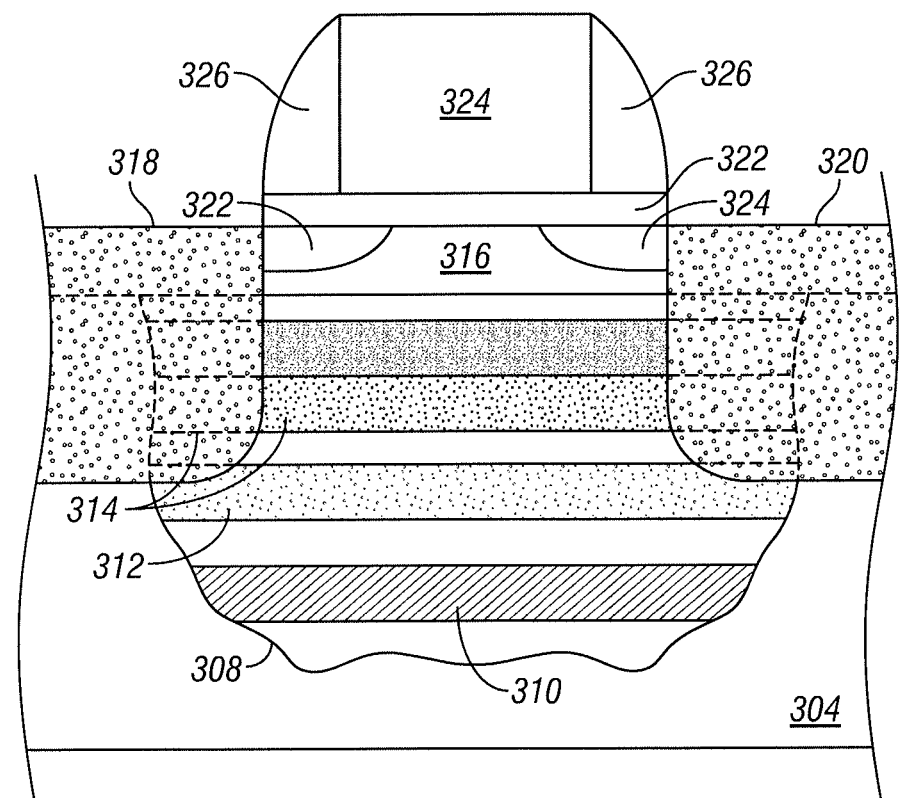

In FIG. 3F, a gate dielectric 322, a gate region 324, and sidewall spacers 326 may be formed over undoped channel 316. Note that although a planar CMOS structure is depicted in the FIGURE, alternative transistor structures above the channel 316 may be formed. An n-type material may be implanted to form a source extension 322 and drain extension 324 as well as a source region 318 and a drain region 320.

The above embodiments for using a diffusion-mitigating material in the context of DDC transistors is applicable for both NMOS and PMOS transistors, though typically, such methods may be used more commonly for NMOS and less commonly for PMOS. For PMOS, other materials which in themselves tend to be less diffusive may be used. For instance, antimony may be used for the highly doped regions of the PMOS transistor, thus making potentially unnecessary the use of further diffusion-mitigation measures. For PMOS, energy and dose levels for ion implantation of the dopant material (for instance, antimony) are selected to effect a targeted placement of the profile peak as well as thickness and concentration of the doped region, all of which can affect resultant electrical parameters for the transistor including threshold voltage, junction leakage, drive current, drain-induced barrier lowering, and other parameters. However, an alternative embodiment may be to deposit a blanket epitaxial carbon-infused silicon on the substrate surface in advance of or after the doping of the highly doped regions (for instance, the screen layer and the threshold voltage setting layer). Such a blanket epitaxial carbon-infused silicon may serve as an overall dopant migration inhibitor for all devices. Implanted dopant migration mitigation material (for instance, carbon) may be used to augment in-situ epitaxially grown material as needed. Adjacent transistor structures 300 may be separated by isolation regions 326, with the isolation regions being preferably formed after the epitaxial layer is formed. Further conventional process steps can then be performed to complete the fabrication to form an integrated circuit.

Figure 4:
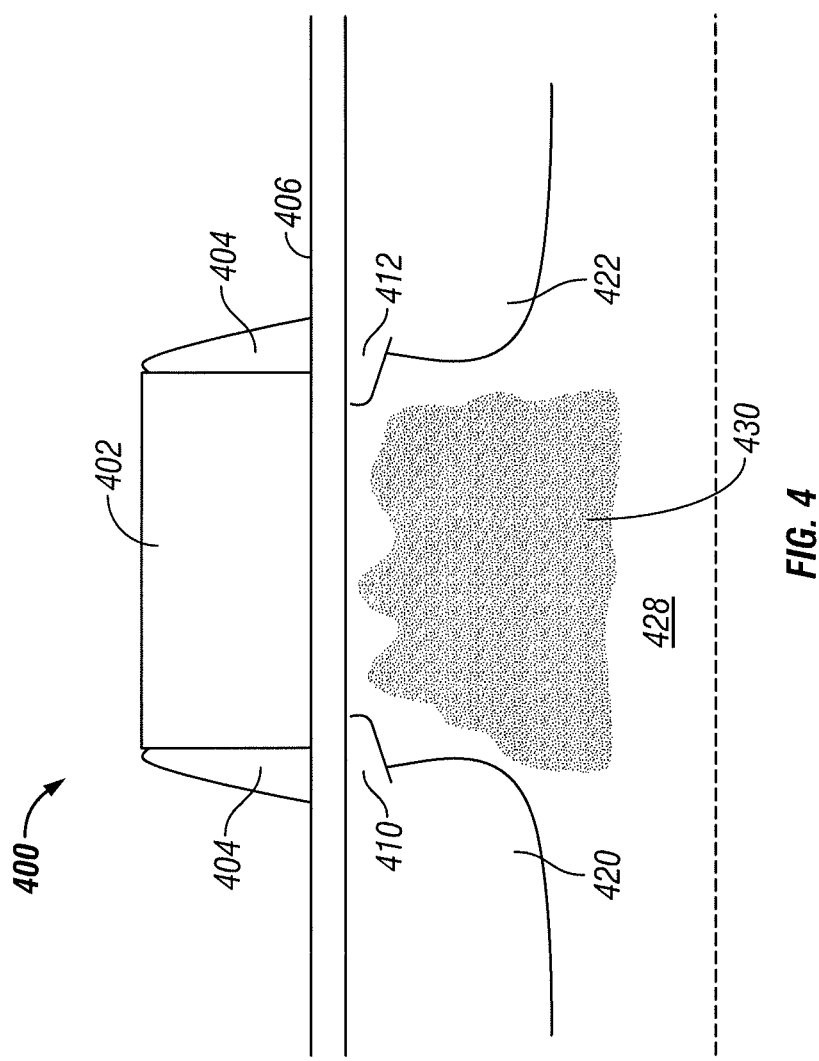
FIG. 4 illustrates an example of a transistor structure without a screening layer, with carbon added to the channel.

As a further note, as shown in FIG. 4, preselected carbon implants may be performed in the absence of a screening layer or threshold voltage tuning layer (not shown). There is provided a transistor 400 which contains, in this example, a gate 402 and spacer structures 404 on either side of gate 402 overlying a gate dielectric 406 which may be a thermally grown oxide or other suitable material. There may be source and drain extension structures 410 and 412 extending below and near the edges of gate 402 with spacers 404. There may be deeper source and drain structures 420 and 422, doped to a level sufficient to provide a suitable contact to metallization which may be formed thereabove (not shown).

There may not be an undoped epitaxially grown channel as preferably used for DDC transistor structures. Carbon addition 430 may be made by ion implantation directly into substrate 428 which may be previously doped with wells (not shown) or the wells may be formed after the carbon implants. Instead of implanted carbon, carbon addition 430 may be epitaxially introduced by way of an epitaxial material growth over substrate 428 that includes carbon, resulting in carbon addition 430 appearing in the channel. A benefit of using carbon-added epitaxially grown silicon is the avoidance of using germanium pre-amorphization implants. If instead, carbon is put into the substrate by way of ion implantation, then germanium pre-amorphization may be typically followed by recrystallization anneal to secure the carbon into the substitutional lattice locations. Germanium pre-amorphization implant may, however, be avoided with the selection of an appropriate ion implantation process for the carbon, for instance through use of low-temperature ion implantation methods.

Preselected carbon implants (the process shall be referred to herein as "implants" though in-situ epitaxially introduced carbon alone or in combination with ion implantation of carbon may be used) may be used in the context of a DDC transistor, with conventional channel doping implementations or halo doping implementations, or both. The carbon is introduced into substrate 428 so that the carbon concentration and, as applicable, the profile may be matched to those areas of the source 420, drain 422, source extension 410, and drain extension 412 tending to produce unwanted out-diffusion. Typically, carbon may be added to substrate 428 uniformly in the deep source 420/drain 422 area with the concentration being modulated at the source extension 410/drain extension 412 area to fine-tune the electrical parameters of the transistor device which may be affected by tolerance for more or less out-diffusion of material from the doped areas 410, 412, 420 and 422.

Preselected carbon implants may be used with the isolation structures formed first or right after placement of carbon addition 430, or sometime later in the fabrication process sequence. Preferably, the isolation structures are formed after the carbon implants.

Energy for implanting the carbon implants may range from 0.5 to 10 keV for a dose of $8\times10^{13}$ to $2\times10^{15}$ atoms/cm$^2$ or other dose to result in a sufficient concentration of carbon to effect a stop for potential diffusion of the later formed source 420, drain 422, source extension 410, and drain extension 412. Concentration of the carbon in the semiconductor lattice may be, for instance, $1\times10^{18}$ atoms/cm$^3$ to $8\times10^{20}$ atoms/cm$^3$ where the concentrations may be more precisely located to be in the vicinity of the source extension 410/drain extension 412 or source 420/drain 422. The carbon concentration and location of concentration profile peaks can be tuned with the selection of energies and dose, as can be seen in the examples of FIGS. 1A TO 1C, and FIGS. 2A TO 2B. If a dual carbon profile is desired, the profile can be achieved using a combination of ion implant steps or using a combination of in-situ carbon epitaxial growth at a designated carbon concentration with separately performed ion implantation.

A benefit of using carbon implants in the channel is multi-fold. In the case of DDC transistors, carbon helps to mitigate against unwanted diffusion doped regions to effect a desired and specific dopant profile. In the case of conventional transistors, there is usually a greater problem of out-diffusion from the source and drain structures due to high temperature anneals that take place later in the process sequence. The high temperature anneals may cause excessive out-diffusion of material, for instance boron or phosphorous, from the source and drain structures. By introducing carbon into the channel prior to the initiation of the anneals that may cause excessive out-diffusion of the source and drain into the channel region, the otherwise occurring out-diffusion of material from the source and drain structures can be mitigated. Though the carbon implants may be formed at any time prior to the problematic anneals, the carbon implants are preferably formed together with, before, or right after the formation of the wells.

Note that although a well-known structure for a MOSFET is shown in FIG. 4, the embodiment of placing carbon into the channel is useful for a variety of MOSFET structures including structures having shallower junction, raised source and drain, source and/or drain structures created with selective epitaxial growth, having or not having source/drain extensions, or other variations thereof. Placing carbon in the channel is useful for either NMOS or PMOS, and carbon placement to tune dopant profile of adjacent doped structures can be used in non-MOSFET contexts as well, for instance in bipolar or other structures that involve doped regions that should remain in place. Carbon in the channel is useful for numerous types of DDC structures as described above in relation to FIGS. 1A to 1C, 2A to 2B, and 3A to 3F, as well as the previous cases incorporated by reference herein. Carbon in the channel may also be used in three-dimensional transistor structures, for instance finFET devices, where it is desired to block the out-diffusion of source/drain dopant material into a non-doped, lesser doped, or oppositely doped area.

Different process conditions for doping may be implemented across a plurality of transistors in a die. Through selective use of doping conditions across a plurality of transistors, transistor structures may be fabricated with variations in location and height of the peak of the dopant profile so as to effect differing electrical transistor behaviors. Doping conditions within the channel may directly affect certain electrical properties such as threshold voltage. Doping profile of other parts of the transistor, for instance the source and drain, should also be controlled, though out-diffusion that results in a modification of the shape of the source and drain can create problems with transistors not meeting parametric targets. The use of carbon or other dopant migration mitigation materials is effective to hold a dopant material that would otherwise travel through a semiconductor lattice in place to effect a dopant desired profile. More specifically, the use of preselected carbon process conditions to effect a placement of carbon into the substrate has beneficial effects on keeping the target shape for the doped areas. If ion implantation is used for introducing the carbon, the modulation of energy of the implant results in a certain shape of a dopant profile peak. To insert carbon into the substrate, ion implantation, in-situ epitaxial growth, or other methods or combinations thereof may be used to effect a placement of a concentration of carbon species in desired locations.

Although the present disclosure has been described in detail with reference to a particular embodiment, it should be understood that various other changes, substitutions, and alterations may be made hereto without departing from the spirit and scope of the appended claims. For example, although the present disclosure includes a description with reference to a specific ordering of processes, other process sequencing may be followed to achieve the end result discussed herein. Though discussed using specific examples, different materials and process conditions may be used at each point of the fabrication process to create a desired transistor structure. As but one example, the carbon implants may be intermixed with the various boron implants.

Numerous other changes, substitutions, variations, alterations, and modifications may be ascertained by those skilled in the art and it is intended that the present disclosure encompass all such changes, substitutions, variations, alterations, and modifications as falling within the spirit and scope of the appended claims. Moreover, the present disclosure is not intended to be limited in any way by any statement in the specification that is not otherwise reflected in the appended claims.

What is claimed is:

1. A transistor device having a gate, a channel, a source and a drain on either side of the channel, comprising:
 an anti-punchthrough layer in a semiconductor substrate;
 a screening layer above the anti-punchthrough layer, the screening layer defining a depletion width for the transistor channel when a voltage is applied to the gate;
 a dopant migration mitigating material above the anti-punchthrough layer, the dopant migration mitigating material reducing a dopant migration of the screening layer;
 a substantially undoped layer above the screening layer, the channel is formed in the substantially undoped layer; and
 wherein a dopant profile of the screening layer has a peak of which position is shallower than a position of a peak in a dopant profile of the dopant migration mitigating material.

2. The method of claim 1, comprising:
 a threshold voltage set layer above the screening layer;
 wherein the threshold voltage set layer is coextensive with the screening layer and abuts the source and drain and the screening layer extends laterally across the channel.

3. The transistor device of claim 1, wherein the dopant migration mitigating material comprises carbon.

* * * * *